US009508926B2

(12) United States Patent
Kitagawa et al.

(10) Patent No.: US 9,508,926 B2
(45) Date of Patent: Nov. 29, 2016

(54) MAGNETORESISTIVE EFFECT ELEMENT HAVING AN UNDERLAYER AND A SIDE WALL LAYER THAT CONTAIN SCANDIUM

(71) Applicant: KABUSHIKI KAISHA TOSHIBA, Tokyo (JP)

(72) Inventors: Eiji Kitagawa, Yokohama Kanagawa (JP); Minoru Amano, Sagamihara Kanagawa (JP); Megumi Yakabe, Kawasaki Kanagawa (JP); Hiroaki Maekawa, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/637,254

(22) Filed: Mar. 3, 2015

(65) Prior Publication Data
US 2016/0013397 A1    Jan. 14, 2016

(30) Foreign Application Priority Data
Jul. 10, 2014    (JP) .................. 2014-142661

(51) Int. Cl.
*H01L 43/02* (2006.01)
*H01L 29/82* (2006.01)
*H01L 43/08* (2006.01)
*H01L 43/12* (2006.01)
*H01L 43/00* (2006.01)
*H01L 43/10* (2006.01)
H01L 27/22 (2006.01)

(52) U.S. Cl.
CPC .............. *H01L 43/12* (2013.01); *H01L 43/08* (2013.01); *H01L 43/10* (2013.01); *H01L 27/228* (2013.01)

(58) Field of Classification Search
CPC ....... H01L 43/02; H01L 43/08; H01L 43/12; H01L 27/22; H01L 29/82
See application file for complete search history.

(56) References Cited

U.S. PATENT DOCUMENTS

| 8,575,589 | B2* | 11/2013 | Nagashima | H01L 27/101 257/5 |
| 8,576,519 | B1* | 11/2013 | Carey | G11B 5/3929 360/324 |
| 8,716,818 | B2 | 5/2014 | Yoshikawa et al. | |
| 2003/0218834 | A1* | 11/2003 | Kanbe | C23C 14/185 360/313 |
| 2004/0144995 | A1* | 7/2004 | Nagahama | B82Y 10/00 257/200 |
| 2008/0043519 | A1* | 2/2008 | Kitagawa | G11C 11/16 365/158 |
| 2012/0070695 | A1 | 3/2012 | Kitagawa et al. | |
| 2013/0017626 | A1 | 1/2013 | Tomioka | |
| 2013/0037862 | A1* | 2/2013 | Kitagawa | H01L 43/08 257/252 |

(Continued)

FOREIGN PATENT DOCUMENTS

| JP | 2013197524 A | 9/2013 |
| JP | 2014-099497 A | 5/2014 |
| WO | 2015040926 A1 | 3/2015 |

*Primary Examiner* — Thomas L Dickey
*Assistant Examiner* — Damon Hillman
(74) *Attorney, Agent, or Firm* — Patterson & Sheridan, LLP

(57) ABSTRACT

A magnetoresistive effect element includes a recording layer having magnetic anisotropy and a variable magnetization direction, a reference layer having magnetic anisotropy and an invariable magnetization direction, an intermediate layer between the recording layer and the reference layer, an underlayer containing scandium (Sc) and disposed on a surface side of the recording layer opposite to a surface side on which the recording layer is disposed, and a side wall layer containing an oxide of Sc and disposed on side surfaces of the recording layer and the intermediate layer.

20 Claims, 10 Drawing Sheets

(56) References Cited

U.S. PATENT DOCUMENTS

| | | | |
|---|---|---|---|
| 2013/0119495 A1* | 5/2013 | Vetr | H01L 43/08 257/421 |
| 2013/0307099 A1* | 11/2013 | Kitagawa | H01L 29/82 257/421 |
| 2014/0080227 A1 | 3/2014 | Tomioka | |
| 2014/0131649 A1 | 5/2014 | Daibou et al. | |
| 2014/0131824 A1 | 5/2014 | Kitagawa et al. | |

\* cited by examiner

MAGNETORESISTIVE EFFECT ELEMENT HAVING AN UNDERLAYER AND A SIDE WALL LAYER THAT CONTAIN SCANDIUM

CROSS-REFERENCE TO RELATED APPLICATION

This application is based upon and claims the benefit of priority from Japanese Patent Application No. 2014-142661, filed Jul. 10, 2014, the entire contents of which are incorporated herein by reference.

FIELD

Embodiments described herein relate generally to a magnetoresistive effect element.

BACKGROUND

A magnetic memory device of the related art includes a magnetoresistive effect element for storing data therein.

DETAILED DESCRIPTION

Embodiments provide a magnetoresistive effect element in which operational reliability is improved.

In general, according to one embodiment, a magnetoresistive effect element includes a recording layer having magnetic anisotropy and a variable magnetization direction, a reference layer having magnetic anisotropy and an invariable magnetization direction, an intermediate layer between the recording layer and the reference layer, an underlayer containing scandium (Sc) and disposed on a surface side of the recording layer opposite to a surface side on which the recording layer is disposed, and a side wall layer containing an oxide of Sc and disposed on side surfaces of the recording layer and the intermediate layer.

Magnetic memory devices include a spin-transfer torque (STT) type magnetoresistive random access memory (MRAM). In the STT-MRAM, for example, a magnetoresistive effect element is used as a memory element. One type of the magnetoresistive effect element includes two magnetic layers (recording layer and reference layer) and a non-magnetic layer (intermediate layer) provided therebetween. Each layer provided in the magnetoresistive effect element is formed into an elemental shape by, for example, physical etching or the like.

However, the components of the etched magnetic material may adhere to the side wall of tunnel barrier layer as a deposited layer. This deposited layer may cause an electric short between the layers.

According to an embodiment to be described below, the electric short caused by a deposited layer may be suppressed and thus the operational reliability of the magnetoresistive effect element may be improved.

The magnetoresistive effect element according to the embodiment will be described with reference to the drawings. In each drawing, the same reference symbols are attached to the same portions. Further, a repetitive explanation will be made only when necessary.

First Embodiment

A magnetoresistive effect element according to an embodiment will be described with reference to FIGS. 1 to 4.

1. Configuration Example of MTJ Element

Figure 1:
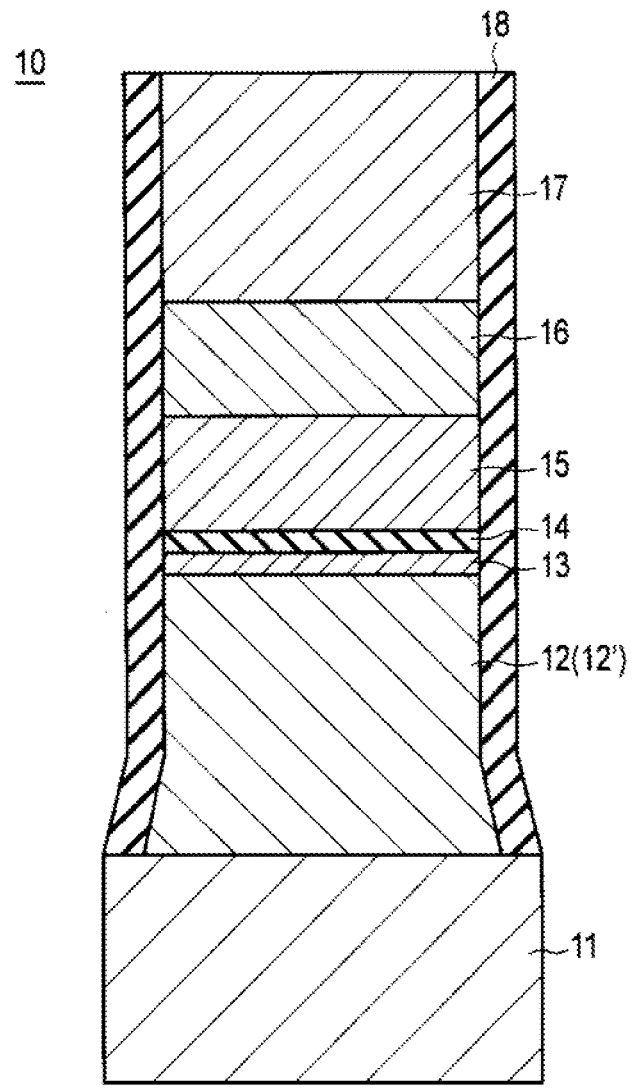
FIG. 1 is a cross-sectional view of an MTJ element according to a first embodiment.

With reference to FIG. 1, a configuration example of a magnetic tunnel junction (MTJ) element will be described as a magnetoresistive effect element according to an embodiment. The MTJ element is configured to have different resistance states according to the direction of a current flowing through the MTJ element. The phenomenon showing different resistance according to states is referred to as a magnetoresistive effect. The MTJ element holds data using the magnetic nonvolatile property.

Schematic Configuration of MTJ Element

As illustrated in FIG. 1, an MTJ element 10 includes an underlayer 12 disposed on a lower electrode 11, a recording layer 13 disposed on the underlayer 12, an intermediate layer 14 disposed on the recording layer 13, and a reference layer 15 disposed on the intermediate layer 14. The MTJ element 10 further includes a side wall layer 18 disposed at least on a side wall of the recording layer 13 and a side wall of the intermediate layer 14. A stopper layer 16 is disposed on the reference layer 15, and an upper electrode 17 is disposed on the stopper layer 16.

The recording layer 13 and the reference layer 15 are magnetic layers having magnetic anisotropy. The recording layer 13 and the reference layer 15 have magnetic anisotropy in directions, for example, intersecting with the layer surfaces thereof. The layer surface refers a surface in which one layer faces another layer. The direction intersecting with the layer surface refers a direction perpendicular or substantially perpendicular to the layer surface. That is, for example, the MTJ element 10 is disposed as a perpendicular magnetization MTJ element having perpendicular magnetic anisotropy.

The recording layer 13 is formed so as to have a variable magnetization direction. That is, when a current flowing through the MTJ element 10 is supplied to the recording layer 13, the magnetization direction of the recording layer 13 is maintained or reversed according to the direction of the current. More specifically, when a current for reversing the magnetization direction of the recording layer 13 is supplied to the recording layer 13, spin-polarized electrons are generated in the recording layer 13. The angular momentum of the electrons is transmitted to the magnetization (spin) of the recording layer 13, and the magnetization direction is reversed. For example, when the current flows from the recording layer 13 to the reference layer 15, the magnetization directions of the recording layer 13 and the reference layer 15 are stabilized such that the magnetization directions are parallel with each other. Contrarily, when the current flows from the reference layer 15 to the recording layer 13, the magnetization directions of the recording layer 13 and the reference layer 15 are stabilized such that the magnetization directions are anti-parallel with each other. The recording layer 13 is also referred to as a magnetization free layer, or the like.

The reference layer 15 is configured to have an invariable magnetization direction. That is, even when a magnetization reversal current for reversing the magnetization direction of the recording layer 13 is supplied to the reference layer 15, the magnetization direction of the reference layer 15 is not reversed. In other words, in order to reverse the magnetization direction of the reference layer 15, a current value higher than that required to reverse the magnetization direction of the recording layer 13 is required. The reference layer 15 is also referred to as a PIN layer, a magnetization invariable layer, or the like.

The recording layer 13, the intermediate layer 14, and the reference layer 15 form a magnetic tunnel junction. The MTJ element 10 is configured to store data according to the magnetization states of the recording layer 13 and the reference layer 15. Specifically, the MTJ element 10 is configured to store data "1" or data "0" according to whether the magnetization directions of the recording layer 13 and the reference layer 15 is parallel (low resistance state) or anti-parallel (high resistance state) with each other. The intermediate layer 14 is also referred to as a tunnel barrier layer, a non-magnetic layer, or the like.

Configuration of Each Layer

The recording layer 13 includes, for example, cobalt iron boron (CoFeB) as a magnetic material. The recording layer 13 may have a laminated structure of two or more layers. In this case, the recording layer 13 may have a laminated structure of two magnetic layers including, for example, CoFeB or CoFe as a main component and a non-magnetic metal layer interposed therebetween. Hereinafter, a layer including CoFeB as a main component is referred to as a CoFeB layer, and a layer including CoFe as a main component is referred to as a CoFe layer. In addition, the same style of description will be used for various layers including predetermined materials as main components. High melting point transition metals such as tantalum (Ta), lanthanoid metals, or the like may be included in the non-magnetic metal layer as a main component. By using such a non-magnetic metal layer, the magnetic junction of the two magnetic layers through the non-magnetic metal layer may be maintained while the mutual diffusion between the non-magnetic metal layer and the magnetic layers is suppressed. Specifically, for example, the recording layer 13 may have a laminated structure of CoFeB/Ta/CoFeB, a laminated structure of CoFeB/Ta/CoFe, or the like. The laminated structure of CoFeB/Ta/CoFeB is a structure in which a CoFeB layer, a Ta layer, and a CoFeB layer are laminated, and the laminated structure of CoFeB/Ta/CoFe is a structure in which a CoFeB layer, a Ta layer, and a CoFe layer are laminated. Other laminated structures hereinafter will be described in the same manner. The thickness of the recording layer 13 is, for example, about 1.5 nm. It is preferable that the crystallization degree of the recording layer 13 be lower than the crystallization degree of the reference layer 15. At this time, at least, the crystallization degree of the recording layer 13 near the side adjacent to the intermediate layer 14 only has to be lower than the crystallization degree of the reference layer 15 near the side adjacent to the intermediate layer 14. Alternatively, it is preferable that the crystal grains of the recording layer 13 be smaller than the crystal grains of the reference layer 15. In other words, at least, the crystal grains of the recording layer 13 near the side adjacent to the intermediate layer 14 only has to be smaller than the crystal grains of the reference layer 15 near the side adjacent to the intermediate layer 14. More specifically, it is preferable that the recording layer 13 include microcrystal grains or have an amorphous structure.

The crystallization degrees of the recording layer 13 and the reference layer 15 may be measured by, for example, TEM analysis or the like. As a method for evaluating the crystallization degree using a TEM, for example, a method using electron beam diffraction analysis, a method by dark field image analysis using a selected field of a TEM, or the like may be used. In the electron beam diffraction analysis, as long as a single ring shape is observed, it is possible to determine that an object to be observed is in an amorphous state. As long as a spot or a multiple ring shape is observed, it is possible to determine that an object to be observed is crystallized. In this manner, in the electron beam diffraction analysis, whether the crystallization degree is high or low may be evaluated by tones of a spot or a ring. In the dark field image analysis, a high luminance portion is a crystallized portion and whether the crystallization amount is large or small may be evaluated by measuring the area of the high luminance portion.

The reference layer 15 includes, for example, terbium cobalt iron (TbCoFe) as a magnetic material. Alternatively, the reference layer 15 may be a crystal layer having an artificial lattice structure in which Co and platinum (Pt) are laminated, an L10 structure in which Fe and Pt are laminated, or the like. It is preferable that at least a part of the reference layer 15 be crystallized. Alternatively, the reference layer 15 may have a layer surface or a crystal structure having different spin symmetry in a direction intersecting with the layer surface. When the reference layer 15 has such a layer surface or crystal structure, the magnetic anisotropy is induced in the direction intersecting with the layer surface.

The intermediate layer 14 includes, for example, magnesium oxide (MgO) as a non-magnetic material. It is preferable that at least a part of the intermediate layer 14 be crystallized. When the intermediate layer 14 includes MgO, the magnetoresistance ratio (MR ratio) of the MTJ element 10 may be high. The MR ratio is a resistance ratio of a magnetoresistive effect element in a low resistance state with respect to a resistance of a magnetoresistive effect element in a high resistance state. The thickness of the intermediate layer 14 is, for example, about 1 nm.

The underlayer 12 includes, for example, scandium (Sc). More specifically, the underlayer 12 includes, for example, ScHfB (scandium-hafnium boron). For example, the content of Sc in ScHfB is 40 atom % or more, preferably more than 50 atom % and less than 85 atom %. That is, it is more preferable that Sc be included in ScHfB as a main component. Further, it is preferable that the underlayer 12 include microcrystal grains of 3 nm or less or have an amorphous structure. The underlayer 12 has a resistance that is lower than at least the resistance of the intermediate layer 14 and is conductive, for example. However, the underlayer 12 may have a laminated structure of two or more layers including an insulating layer as described later. In this case, Sc only has to be contained in one or more layers among the plural layers in the underlayer 12. For example, the thickness of the underlayer 12 is 7 nm or more and 30 nm or less, preferably 10 nm or more and 15 nm or less, and, for example, about 15 nm.

The side wall layer 18 covers the side walls of layers from the underlayer 12 to the upper electrode 17. However, the side wall layer 18 may be disposed at least on the side wall of the recording layer 13 and on a part of the side wall of the intermediate layer 14. When the layers from the reference layer 15 to the underlayer 12 are patterned into a shape of the MTJ element, some of atoms of the etched underlayer 12 are deposited on the side walls of the recording layer 13, the intermediate layer 14, and the like. The side wall layer 18 includes elements that are derived from the underlayer 12. That is, the side wall layer 18 includes elements that are same as the elements included in the underlayer 12, for example, Sc. More specifically, the side wall layer 18 includes Sc and Hf. The side wall layer 18 may include boron (B). Further, the side wall layer 18 includes oxygen (O), and at least parts of Sc and Hf included in the side wall layer 18 are oxidized. That is, the side wall layer 18 includes oxides of Sc and Hf. The side wall layer 18 may include an oxide of ScHfB. When the side wall layer 18 includes such oxides, the side wall layer 18 has a resistance that is higher than the resistance of the intermediate layer 14 and has insulating properties.

The content percentage of Sc included in the side wall layer 18 is the same as the content percentage of Sc included in the underlayer 12 and is, for example, 40 atoms % or more, preferably more than 50 atom % and less than 85 atom %. That is, it is more preferable that Sc be included in ScHfB as a main component. In addition, it is preferable that the content percentage of B included in the side wall layer 18 be lower than the content percentage of B included in the underlayer 12. More specifically, the content percentage of B in the side wall layer 18 is preferably 5 atom % or more and 30 atom % or less. For example, the thickness of the side wall layer 18 is 0.5 nm or more and 3.0 nm or less, preferably 1.0 nm or more and 1.5 nm or less, and for example, about 1 nm.

The upper electrode 17 includes, for example, Ta as a conductive material. The stopper layer 16 includes, for example, ruthenium (Ru). The stopper layer 16 functions as an etching stopper when the upper electrode 17 is patterned by etching or the like. The patterned upper electrode 17 functions as an electrode and also functions as a mask when the reference layer 15, the intermediate layer 14, the recording layer 13, and the underlayer 12 are patterned by etching or the like. Accordingly, for the material of the upper electrode 17, similar to the above-mentioned Ta, a material having excellent diffusion resistance and excellent etching resistance at low electric resistance is preferably used.

Figure 9:
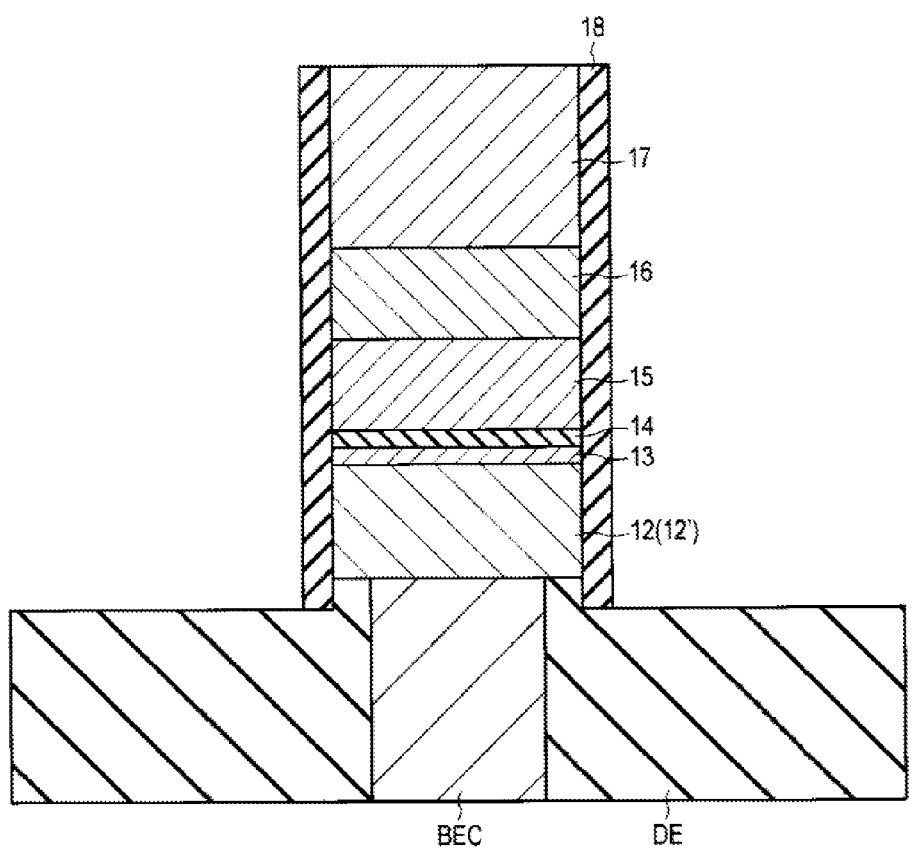
FIG. 9 is a cross-sectional view of another MTJ element according to the first embodiment.

The lower electrode 11 includes, for example, Ta, Cu, or the like as a conductive material. The lower electrode 11 may have a laminated structure including layers of these metals. As illustrated in FIG. 9, in the embodiment, a contact wiring (contact plug) BEC of W or the like may be used instead of the lower electrode 11. In this case, the contact wiring BEC has an upper surface in which a metal material incorporated into an insulating film DE is flattened by CMP or the like. Each layer of the MTJ element 10 is formed on the flattened upper surface of the contact wiring BEC.

2. Method for Manufacturing MTJ Element

Using FIGS. 2A to 2D, an example of a method for manufacturing the MTJ element 10 will be described.

In a process of manufacturing the MTJ element 10, a substrate on which various layers illustrated in FIGS. 2A to 2D are laminated is prepared. That is, at least conductive layers 11m, 12m, and 13m, an insulating layer 14m, and conductive layers 15m, 16m, and 17m are sequentially formed above the substrate (not illustrated). In an etching process, which will be described later, the lower electrode 11 is formed from the conductive layer 11m, the underlayer 12 is formed from the conductive layer 12m, the recording layer 13 is formed from the conductive layer 13m, the intermediate layer 14 is formed from the insulating layer 14m, the reference layer 15 is formed from the conductive layer 15m, the stopper layer 16 is formed from the conductive layer 16m, and the upper electrode 17 is formed from the conductive layer 17m, respectively. That is, through the etching process or the like, each layer is formed into the shape of the component layer of the MTJ element 10. The etching process is also referred to as element isolation processing.

In the above description, the conductive layers 13m and 15m may be formed such that crystallization degree of the recording layer 13 is lower than crystallization degree of the reference layer 15 and/or that the crystal grains of the recording layer 13 are smaller than the crystal grains of the reference layer 15.

Such a crystal structure may be obtained by, for example, increasing the crystallization temperature of the conductive layer 13m and decreasing the crystallization temperature of the conductive layer 15m. Specifically, when the conductive layers 13m and 15m include CoFeB, the content percentage of B in the conductive layer 13m is preferably higher than 20 atom % and the content percentage of B in CoFeB in the conductive layer 15m is preferably 20 atom % or less. With this composition, the crystallization amount of the conductive layer 15m (reference layer 15) can be larger than the crystallization amount of the conductive layer 13m (recording layer 13).

Alternatively, the above-described crystal structure may be obtained in such manner that a layer for suppressing the crystallization of the conductive layer 13m is provided adjacent to the conductive layer 13m and a layer for promoting the crystallization of the conductive layer 15m is provided adjacent to the conductive layer 15m.

For the adjacent layer for suppressing the crystallization of the conductive layer 13m, for example, nitrogen (N) is preferably used. Since N tends to be strongly bonded with B, stable BN can be formed and the movement of B is suppressed. As a result, the crystallization and crystal growth of the conductive layer 13m may be suppressed and thus the conductive layer 13m may be maintained in a microcrystal grain state or an amorphous state. However, it is necessary to suppress diffusion of N that is adjacent to the conductive layer 13m into the conductive layer 13m and deterioration in polarizability caused as a result. For example, it is possible to suppress the diffusion of N into the conductive layer 13m by disposing a nitride having a high melting point (1500° C. or higher) adjacent to the conductive layer 13m. Specifically, it is possible to use a nitride such as aluminum nitride (AlN), aluminum scandium nitride (AlScN), aluminum titanium nitride (AlTiN), aluminum zirconium nitride (AlZrN), aluminum hafnium nitride (AlHfN), or aluminum boron nitride (AlBN) in the conductive layer 12m adjacent to the conductive layer 13m. Alternatively, N may be contained in a part of the conductive layer 13m.

In order to promote the crystallization of the conductive layer 15m, a layer for promoting diffusion of B is disposed on a side opposite to the side of the surface of the conductive layer 15m which is adjacent to the insulating layer 14m. Alternatively, a layer that promotes diffusion of B may be disposed in the conductive layer 15m. In order to promote diffusion of B, a material that promotes forming of boride is preferably used for the promoting layer. For the layer adjacent to the conductive layer 15m, Ta and Hf are preferable. When a material that promotes diffusion or absorption of B is used for the conductive layer 15m itself, a rare earth perpendicular magnetic layer is preferably disposed adjacent to CoFeB.

In the above description, materials having an amorphous structure or microcrystal grains of 3 nm or less are used for the conductive layer 12m, which will be patterned to the underlayer 12. When such materials are used for the conductive layer 12m, the formed conductive layer 12m (underlayer 12) is flattened, and thus the irregularities of the insulating layer 14m (intermediate layer 14) and the conductive layer 13m (recording layer 13) may be reduced.

Figure 2A:
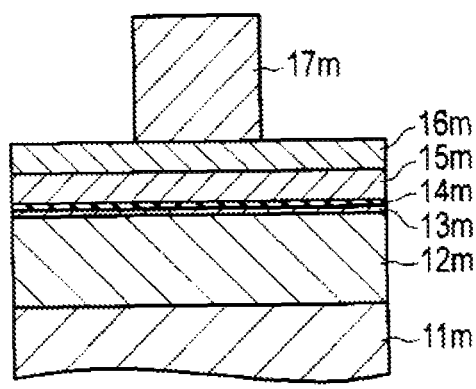
FIGS. 2A to 2D are flow diagrams illustrating a method for manufacturing the MTJ element according to the first embodiment.

As illustrated in FIG. 2A, the conductive layer 17m is patterned so as to have the shape of the upper electrode 17. Specifically, a resist pattern (not illustrated) is formed on the conductive layer 17m, and reactive ion etching (RIE) is carried out using a corrosive gas such as a halogen gas and using the resist pattern as a mask. The conductive layer 16m functions as an etching stopper when RIE is performed.

Next, the layers from the conductive layer 15m to the conductive layer 12m are processed using the patterned conductive layer 17m as a mask. The magnetic materials used for the conductive layers 13m, 15m and the like have low volatility with respect to a halogen gas or the like and high resistance to patterning by RIE or the like. For the patterning of these layers, for example, an ion milling etching (hereinafter, ion milling or milling) method is used. The ion milling method is one of physical etching methods. During the ion milling, a layer to be etched is processed through an ion sputtering phenomenon. For the ion milling method, for example, ions of a rare gas such as argon (Ar), krypton (Kr), or xenon (Xe) or an inert gas are used. In the embodiment, ion milling is performed in two stages.

Figure 2B:
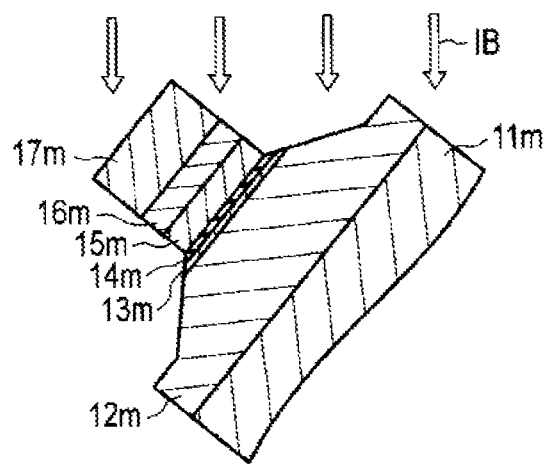

As illustrated in FIG. 2B, a first ion milling is performed in a state in which the incident angle of an ion beam IB is inclined to the substrate. Specifically, the ion milling is performed in a state in which the incident angle of the ion beam IB incident onto the substrate is set to for example, 50° (0° is defined an angle perpendicular to the substrate), and the substrate is rotated. However, the inclination of the substrate to the ion beam IB is relative and thus the ion beam IB may be inclined to the substrate.

When the ion milling is performed, the conductive layers 12m and 13m, the insulating layer 14m, and the conductive layers 15m, and 16m may be processed and adhering substances are prevented from adhering to the side walls of these layers by sputtering. In the ion milling, by the sputtering of the ion beams IB to a surface to be processed, a material structuring the surface to be processed is removed from the surface and adheres to the surface again. When the incident angle of the ion beam IB to the substrate is set to, for example, 0°, structural materials of each layer are mainly removed in the lamination direction of the layers. With the removal of the structural materials, the side wall of each layer is exposed and the structural materials mainly sputtered from each layer adhere to the exposed side wall of each layer again. As described above, when the incident angle of the ion beam IB to the substrate is set to 50°, the processing may be performed without the re-adhesion of the structural materials to both the surface in the laminated direction and the exposed side wall of each layer being dominant. That is, the amount of the structural materials which is more than the re-adhesion amount of the structural materials may be removed.

The first ion milling is performed until at least the conductive layer 12m is exposed. That is, a portion extending from the conductive layer 16m to the conductive layer 13m is almost completely removed. However, the shape of the portion after the processing is a slightly skirt-like shape (tapered shape). When the first ion milling is performed with the substrate inclined, few or no materials of the conductive layer 13m to the conductive layer 16m sputtered with the ion beam IB are deposited on the side walls after the processing.

Figure 2C:
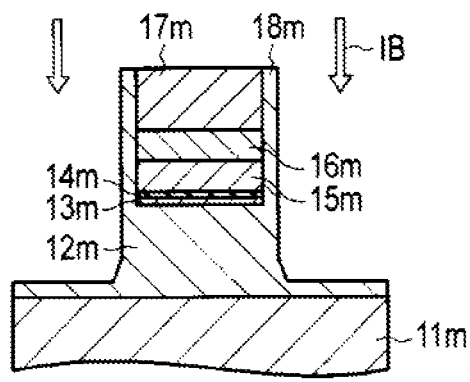

As illustrated in FIG. 2C, a second ion milling is performed in a state in which the incident angle of the ion beam IB inclined to the substrate is set to, for example, 0°. In the second ion milling, the conductive layer 12m is mainly processed. Some of elements included in the structural material of the conductive layer 12m adhere to the side walls again after the processing of the layers from the conductive layer 17m to the conductive layer 12m, and thus a deposited layer 18m is formed. However, the deposited layer 18m may be formed at least on the side wall of the conductive layer 13m and a part of the side wall of the insulating layer 14m. The deposited layer 18m includes the elements included in the side wall layer 18, such as Sc, Hf, and B.

The first and second ion milling process is performed while vacuum state is maintained. It is preferable that little or no oxygen be included in the deposited layer 18m in the ion milling.

By the second ion milling, the portion of the conductive layer 12m to be removed is almost completely removed. However, it is preferable that the conductive layer 12m slightly remain and the conductive layer 11m not be exposed. In addition, when the ion milling is performed such that the incident angle of the ion beam IB to the substrate is 0°, a trenching effect is obtained and the skirt-like portion formed in the first ion milling is removed. Accordingly, an almost perpendicular shape is formed from the conductive layer 16m to the conductive layer 13m. The skirt-like portion of the recording layer 13 formed in the first ion milling is a damaged layer in which ion mixing or ion implantation occurs by the ion milling. When such a damaged layer is present, a deterioration in the non-volatile property of the storage layer or an increase in a write current is caused and thus it is preferable to completely remove the damaged layer. However, due to the affection of the first ion milling, for example, the shape of the conductive layer 12m after the second ion milling may be a slightly skirt-like shape.

As illustrated in FIG. 9, when the contact wiring BEC is used instead of the lower electrode 11, it is preferable that the conductive layer 12m be completely removed and etching be performed on the upper layer portion of the insulating film DE which surrounds the contact wiring BEC.

Figure 2D:
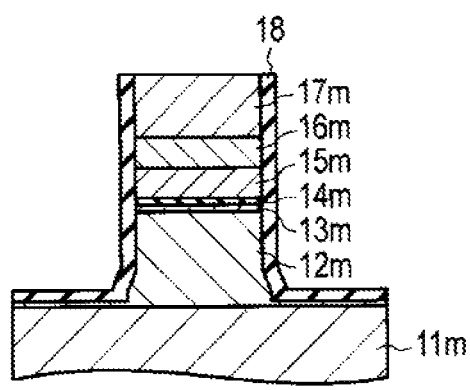

As illustrated in FIG. 2D, at least a part of the deposited layer 18m is oxidized and the side wall layer 18 is formed from the side wall of the conductive layer 17m to the side wall of the conductive layer 12m. The deposited layer 18m is naturally oxidized by exposing the substrate on which the deposited layer 18m is formed to the atmosphere. In order to more reliably oxide the deposited layer 18m, oxidation treatment using oxygen, oxygen plasma, ozone, an oxygen radical, or the like may be performed in a vacuum atmosphere.

Then, an insulating film (not illustrated) is deposited so as to cover the entire structure and further the conductive layer 11m is patterned so as to have the shape of the lower electrode 11. Similar to the conductive layer 17m, the conductive layer 11m is patterned by, for example, photolithography, RIE, or the like. The remaining conductive layer 12m is removed together at this time.

As described above, each layer is separated into each element (cell) and thus the MTJ element 10 is manufactured.

Further, processing methods in each process, an order of each process, and the like are not limited to the above-described examples. For example, after the conductive layer 11m is patterned, the deposited layer 18m may be oxidized. Each layer may be patterned by physical etching other than ion milling etching.

3. Effects According to Embodiment

According to the embodiment, one or more following effects are obtained.

(A) According to the embodiment, the underlayer 12 includes Sc, and the side wall layer 18 includes an oxide of Sc. Metal Sc is susceptible to oxidization and an oxide of Sc has insulating properties. That is, the MTJ element 10 includes the side wall layer 18 having high resistance. Accordingly, for example, it is possible to prevent an electric short from occurring between the layer and another layer due to adhesion of a conductive deposited layer to the side wall of any of the layers. Therefore, the operational reliability of the MTJ element 10 may be improved.

In the MTJ element, it is preferable that the underlayer have a resistance or a conductivity that is lower at least than the resistance of the intermediate layer. The underlayer behaves as a resistor connected in series to the intermediate layer. When the underlayer is an insulating layer having high resistance, the MR ratio of the MTJ element is low. Thus, for example, defective read of data stored in the MTJ element may occur in some cases. Therefore, for the conductive underlayer, for example, an underlayer including HfB as a main component is used in some cases. In this case, for example, a deposited layer derived from the underlayer or a side wall layer formed by oxidation of the deposited layer is formed on the side wall of each layer. However, by the following reasons, the deposited layer or the side wall layer has low resistance and an electric short between each layer may occur.

Figure 3:
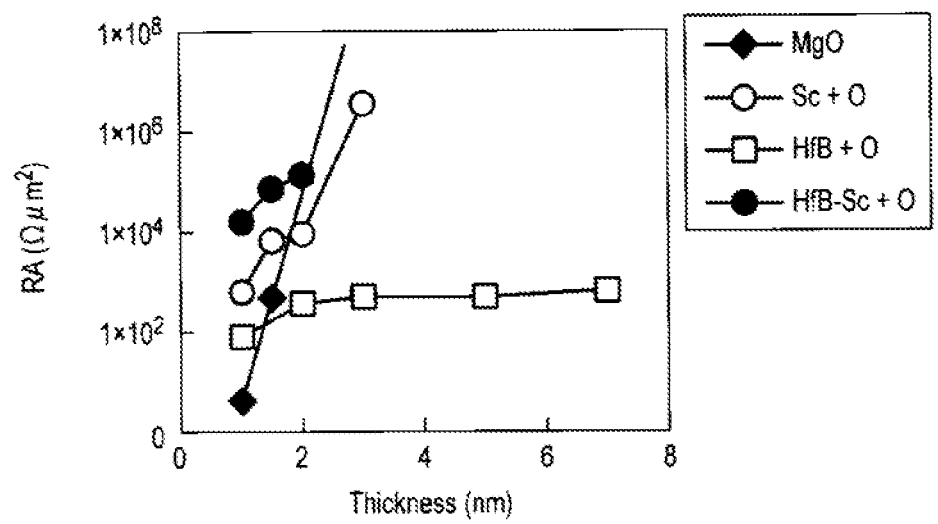
FIG. 3 is a graph for comparing a resistance value of an oxide layer including various kinds of elements with a resistance value of an MgO layer.

FIG. 3 is a graph for comparing a resistance of an oxide layer including various kinds of elements with a resistance of an MgO layer, which is the intermediate layer. The horizontal axis of the graph represents the thickness (nm) of each layer, and the vertical axis represents the area resistance of each layer ($\Omega$ $\mu m^2$). As illustrated in FIG. 3, the MgO layer (♦) is an insulating layer, and as the thickness increases the area resistance increases exponentially. However, even when the thickness of the HfB oxide layer (□ mark) increases, the area resistance rarely increases and the resistance is lower than the resistance of the MgO layer. This result is obtained possibly because there are partially unoxidized HfB and when HfB is thick, HfB is not completely oxidized. On the other hand, as the thickness of the Sc oxide layer (○) increases, the area resistance increases. Further, a ScHfB oxide layer (•) in which Sc, Hf, and B are contained at a ratio of Sc:Hf:B=42:29:29 has a resistance that is higher than the resistance of the Sc oxide layer. This result is obtained possibly because Sc is more susceptible to oxidization than Hf, and a layer containing Sc can be more easily and sufficiently oxidized than a layer containing Hf. In addition, the fact that B contained in the layer in a small amount carries O in the layer so that ScHfB may be wholly oxidized may be a reason that the ScHfB oxide layer has high resistance.

According to the embodiment, the side wall layer 18 includes an oxide of Sc at an arbitrary ratio and is a layer which has resistance higher than at least the resistance of the intermediate layer 14, or an insulating layer. Accordingly, a current such as a read current does not easily flow to the side wall layer 18, and defective read or the like may be suppressed.

Further, according to the embodiment, the underlayer 12 includes Sc at an arbitrary ratio. Accordingly, the side wall layer 18 may contain an oxide of Sc while the resistance of the underlayer 12 is suppressed to be lower than the resistance of the intermediate layer 14. In addition, since the resistance of the underlayer 12 is sufficiently lower than the resistance of the intermediate layer 14, a decrease in the MR ratio of the MTJ element 10 by the underlayer 12 may be suppressed.

(B) According to the embodiment, the side wall layer 18 includes an oxide of Sc. Thus, compared to a case in which the side wall layer includes an oxide of HfB or the like, the damage of the side wall of the recording layer 13 may be reduced.

In the process of manufacturing the MTJ element, the side wall of the storage layer may be damaged by oxygen or moisture in the treatment atmosphere or etching, or the like. The side wall of the storage layer may be also damaged by the exposure of the MTJ element to the atmosphere after the element isolation processing. In the damaged portion of the storage layer, magnetic properties may be deteriorated. The deposited layer or the side wall layer formed on the side wall of the storage layer has a function of protecting the storage layer from the damage.

Figure 4:
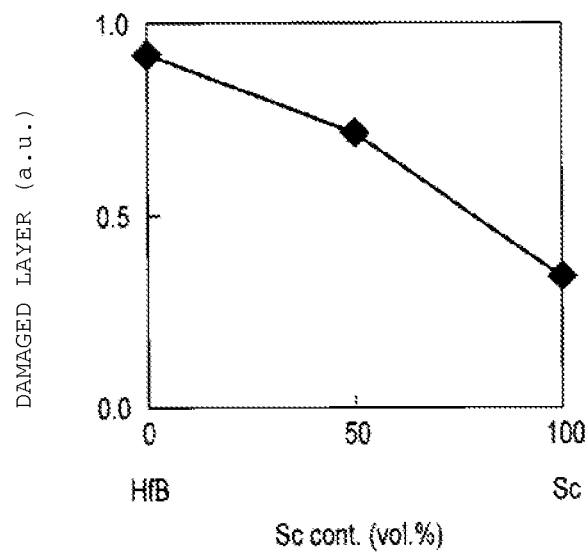
FIG. 4 is a graph illustrating a damaged layer of a CoFeB layer adjacent to the oxide layer including various kinds of elements.

FIG. 4 is a graph illustrating the thickness of a damaged layer of a CoFeB layer adjacent to the oxide layer including various kinds of elements. The thickness of the oxide layer (HfBO layer, ScHfBO layer, or ScO layer) is set to 1 nm. The thickness of the damaged layer is obtained by measuring the width of the portion in which the magnetic properties are deteriorated. The horizontal axis of the graph represents the content percentage (Vol. %) of Sc in the HfB oxide layer. The vertical axis of the graph represents the thickness (a.u.) of the damaged layer of the CoFeB layer. As illustrated in FIG. 4, as the ratio of Sc with respect to the HfB oxide layer is increased, the thickness of the damaged layer of the adjacent CoFeB layer is reduced. According to illustrated in FIG. 3, this result may be obtained because Sc is more susceptible to oxidization than HfB and is highly effective in protecting the side wall of the CoFeB layer.

According to the embodiment, the side wall layer 18 includes an oxide of Sc at an arbitrary ratio. For example, compared to a case in which the side wall layer 18 includes HfBO as a main component without Sc, the thickness of the damaged layer of the recording layer 13 may be reduced. Thus, deterioration in the magnetic properties of the recording layer 13 may be suppressed and the non-volatile property may be improved.

(C) According to the embodiment, the thickness of the side wall layer 18 is 0.5 nm or more and 3.0 nm or less, preferably 1.0 nm or more and 1.5 nm or less, and, for example, about 1 nm. When the side wall layer 18 has such an preferable thickness, although the affection of HfB is suppressed, the side wall of the recording layer 13 may be protected.

Specifically, when the thickness of the side wall layer 18 is set to 3.0 nm or less, and preferably 1.5 nm or less, the susceptibility of HfB to oxidization that appears when the layer of HfB is too thick is suppressed, and the entire side wall layer 18 may be sufficiently oxidized. In addition, when the side wall layer 18 is sufficiently thin, for example, a boron oxide (BO) in the side wall layer 18 is prevented from being impregnated in the recording layer 13 and thus the damage of the recording layer 13 may be prevented from being increased.

On the other hand, when the thickness of the side wall layer 18 is set to 0.5 nm or more and preferably 1.0 nm or more, the damage of oxidization to the recording layer 13 from the side wall layer 18 may be suppressed. When the side wall layer is sufficiently thick, the protection effect for the recording layer 13 by the side wall layer 18 is sufficiently obtained and an increase in the damage of the recording layer 13 may be suppressed.

Figure 5:
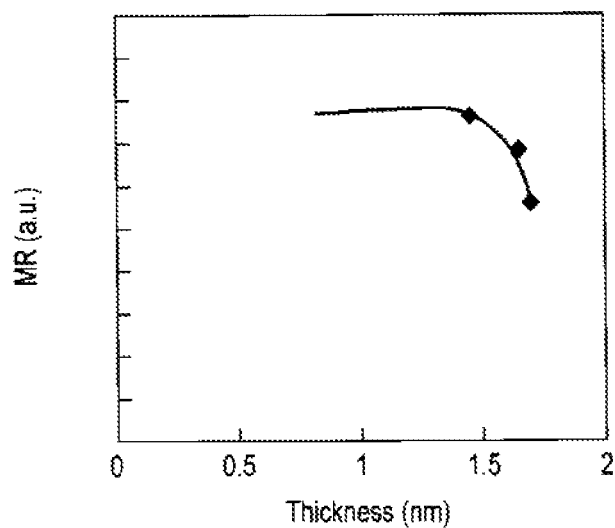
FIG. 5 is a graph of a MR ratio with respect to the thickness of a ScHfB layer of a side wall.

FIG. 5 is a graph of a MR ratio with respect to the thickness of a ScHfB layer of a side wall when $Sc_{42}Hf_{29}B_{29}$ is used for the underlayer and the ScHfB layer is deposited on the side wall. The horizontal axis of the graph represents the thickness (nm) of the ScHfB layer, and the vertical axis represents the MR ratio of the MTJ element. As illustrated in FIG. 5, when the thickness of the ScHfB layer increases, the MR ratio drastically decreases. Therefore, when the side wall layer is excessively thick, a leakage current flows through the side wall layer, and thus, this case is not preferable.

Accordingly, the thickness of the side wall layer 18 is preferably 1.5 nm or less from the viewpoint of reducing the leakage current and achieving a high MR ratio. On the other hand, the thickness is preferably 1 nm or more from the viewpoint of reducing the damage of the recording layer 13 by oxidation. However, when the amount of Sc is increased with respect to HfB, the oxidation damage to the recording layer 13 by selective oxidation of Sc may be reduced with a thin layer. Therefore, by increasing in the content of Sc, even when the thickness of the side wall layer 18 is about 0.5 nm, the oxidation damage may be reduced. In addition, the increase in the content of Sc contributes to improving the insulating properties of the side wall layer 18 by oxidation of Sc. Thus, even when the thickness of the side wall layer 18 is more than 1.5 nm, for example, as long as the thickness thereof is 3 nm or less, poor insulation may be reduced and a high MR ratio may be achieved.

(D) According to the embodiment, the underlayer 12 includes ScHfB. Due to this composition, as described below, the suitable side wall layer 18 may be formed. Further, the underlayer 12 may be formed as a layer which includes microcrystal grains of 3 nm or less or has an amorphous structure and also may be formed as a layer which has high corrosion resistance.

In the underlayer 12, in order to reduce irregularities of the recording layer 13 and the intermediate layer 14 deposited on the upper layer of the underlayer 12 and reduce both an electric short and damage caused by the side wall layer 18 deposited on the side wall of the MTJ element 10 during the element isolation processing of the MTJ element 10, it is necessary to select a proper material.

For example, in order to reduce an electric short and damage caused during the element isolation processing of the MTJ element 10, the side wall layer 18 preferably includes Sc by inclusion of Sc in the composition of the underlayer 12. Since Sc is more susceptible to oxidization than the material used in the record layer 13, the deposited layer 18m including Sc, which is deposited on the side walls of the recording layer 13 and the intermediate layer 14 after the element isolation processing of the MTJ element 10, is selectively oxidized, and thus unintended oxidation of the recording layer 13 and the intermediate layer 14 may be suppressed. The recording layer 13 and the intermediate layer 14 are prevented from being oxidized by Sc in the side wall layer 18, and thus defects of the MTJ element 10 such as increase in resistance, decrease in non-volatile property, increase in a write current, increase in variation between the elements, or the like may be reduced. Further, since the oxidized Sc has very high resistance, a leakage current flowing to the side wall layer 18 may be reduced to nearly zero. Thus, the electric short in the side wall layer 18 may be suppressed, and a deterioration in the MR ratio and poor insulating properties of the MTJ element 10 may be suppressed.

When the above-described effects and the effects of the above-described configurations (A) and (B) are considered, HfB of the underlayer might be completely replaced with Sc; for example, the underlayer might be made of only Sc. However, the layer made of only Sc is easily crystallized when being formed. The crystallized Sc layer may interfere with the crystallization of a conductive layer to be formed above the Sc layer, that is, a layer which becomes a recording layer later. Alternatively, the flatness is deteriorated by the crystallization of the Sc layer (irregularities increase) and a decrease in the MR ratio, a decrease in non-volatile property, and a decrease in reliability and an increase in a write current value may be caused in the recording layer, the intermediate layer, and the reference layer in some cases. Further, Hf, Sc, or the like has low corrosion resistance. Therefore, the underlayer is susceptible to corrosion by a halogen gas or the like used in the following etching process or the like, and the characteristics of the MTJ element are affected in some cases.

According to the embodiment, the underlayer 12 includes, for example, ScHfB including Sc as a main component. HfB is a material having a high melting point, and thus, when a HfB layer is formed to be amorphous by sputtering film formation, an amorphous state may be maintained in heat treatment at 500° C. Therefore, when the conductive layer 12m, which is formed into the underlayer 12, is formed, at least a part of the conductive layer 12m is amorphous by inclusion of HfB in the conductive layer 12m. In addition, since HfB has a large surface energy, the surface easily becomes smooth, and poor insulation may be reduced due to reduction of irregularities. Thus, when the conductive layer 13m, which is formed into the recording layer 13, is formed on the conductive layer 12m, the smooth conductive layer 13m may be formed. Further, by inclusion of B in the underlayer 12, the underlayer 12 is stabilized by boriding and the corrosion resistance of the underlayer 12 may be improved. In addition, Sc is a completely solid-soluble material with respect to Hf, and thus, even when Sc is mixed with HfB, the self-flatness effect of HfB, which has an amorphous structure, may be maintained in the underlayer 12 and both an electric short reduction effect and the damage reduction effect by Sc in the side wall layer 18 may be achieved.

(E) According to the embodiment, the content percentage of Sc in ScHfB of the underlayer 12 and the side wall layer 18 is 40 atom % or more and preferably more than 50 atom % and less than 85 atom %.

Regarding the content percentage of Sc in ScHfB of the underlayer 12 and the side wall layer 18, when the amount of Sc is large, crystallization is promoted and irregularities are generated in the underlayer 12. Meanwhile, when the amount of Sc is small, the amorphous structure is dominant and thus the underlayer 12 is smooth, but the damaged layer by the side wall layer 18 is increased. Thus, both cases are not preferable. When Sc is used, the magnetic damage, poor insulation, and a peroxidation into the MTJ element, caused by the side wall layer 18, may be reduced. When HfB is used, a reduction in poor insulation, an improvement in non-volatile property, and a reduction in a write current by the underlayer 12 may be facilitated. That is, the content of Sc and HfB may be adjusted according to desired properties. At this time, an improvement in perpendicular magnetic anisotropy may be considered as other properties.

Figure 6:
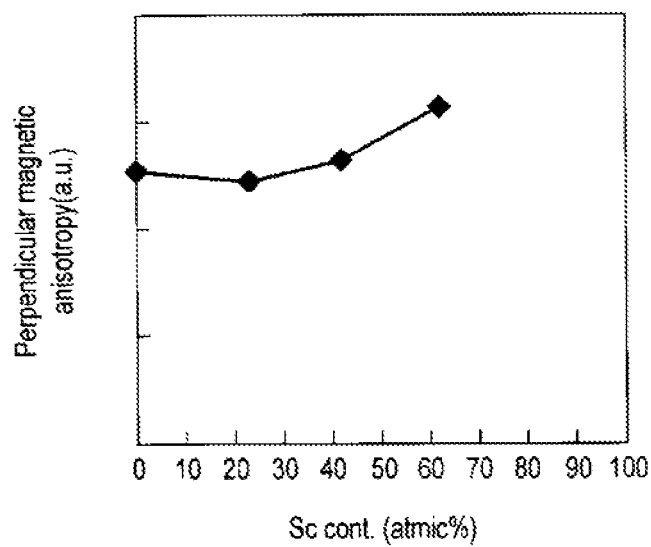
FIG. 6 is a graph illustrating the dependence of perpendicular magnetic anisotropy on a content of Sc.

FIG. 6 is a graph illustrating relationship of perpendicular magnetic anisotropy and the content percentage of Sc. The horizontal axis of the graph represents the content percentage (atom %) of Sc in the ScHfB layer, and the vertical axis represents perpendicular magnetic anisotropy (a.u.) of a CoFeB layer adjacent to the ScHfB layer. As illustrated in FIG. 6, as the content percentage of Sc is increased, the perpendicular magnetic anisotropy of the CoFeB layer may be increased.

Thus, when the content percentage of Sc in ScHfB of the underlayer 12 is set to 40 atom % or more, the perpendicular magnetic anisotropy of the recording layer 13 may be increased.

Further, when the content percentage of Sc in the underlayer 12 is set to more than 50 atom %, the content percentage of Sc in the side wall layer 18 may be set to more than 50 atom %. Thus, a reduction in magnetic damage, a reduction in poor insulation, and a peroxidation into the MTJ element 10 caused by the side wall layer 18 may be achieved.

In addition, when the content percentage of Sc in the underlayer 12 is set to be less than 85 atom %, the flatness of the underlayer 12 may be increased.

(F) According to the embodiment, the content percentage of B included in the underlayer 12 is higher than the content percentage of B included in the side wall layer 18.

As described above, B contained in a small amount promotes oxidation of the entire ScHfB. On the other hand, when the amount of B is large, the oxidized B diffuses into the recording layer, the magnetization of the recording layer disappears, and damage may occur.

Figure 7:
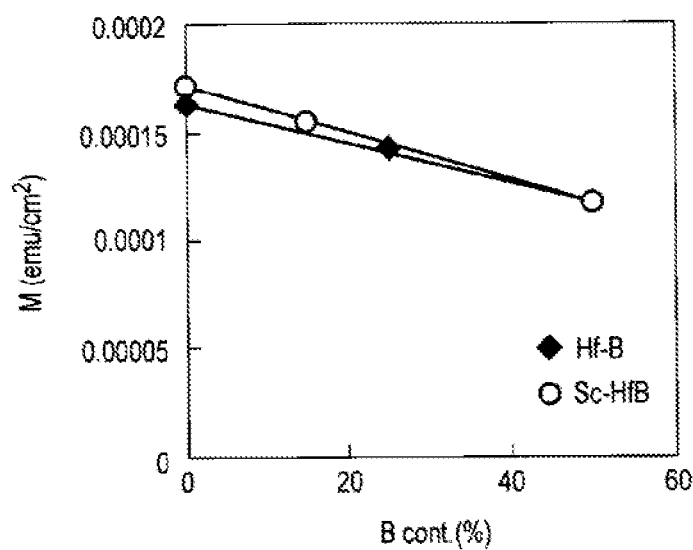
FIG. 7 is a graph in which the magnetization of the CoFeB layer is measured with respect to the amount of B in the adjacent HfB layer and ScHfB layer.

FIG. 7 is a graph in which the magnetization of the CoFeB layer is measured with respect to the amount of B in the HfB layer and the ScHfB layer adjacent to the CoFeB layer. The horizontal axis of the graph represents the content percentage (atom %) of B, and the vertical axis represents the magnetization M (emu/cm$^2$) of the CoFeB layer. As illustrated in FIG. 7, it is found that as the content percentage of B increases, the magnetization of the CoFeB layer decreases. That is, in order to completely oxidize and insulate the side wall layer, B is required. However, excessive B causes damage in the recording layer, and thus is not preferable.

Accordingly, the content of B in the side wall layer 18 is preferably controlled to be 5 atom % or more and 30 atom % or less. On the other hand, the underlayer 12 becomes amorphous by B. Therefore, it is preferable that the content percentage of B capable of forming the smooth underlayer 12 be higher than the content percentage of B included in the side wall layer 18.

(G) According to the embodiment, the thickness of the underlayer 12 is 7 nm or more and 30 nm or less, and preferably 10 nm or more and 15 nm or less.

When the underlayer is thin, during the element isolation processing of the MTJ element, the etching amount of the underlayer is reduced and the thickness of a deposited layer that may be deposited on the side wall of the MTJ element when the underlayer is etched is reduced. Thus, the protecting function of the recording layer and the intermediate layer by the deposited layer or the side wall layer for protecting is deteriorated, and the recording layer and the intermediate layer are affected by oxidation damage due to atmosphere exposure or the like. Thus, the thermal stability factor Δ of the recording layer is decreased by oxidation damage.

Figure 8:
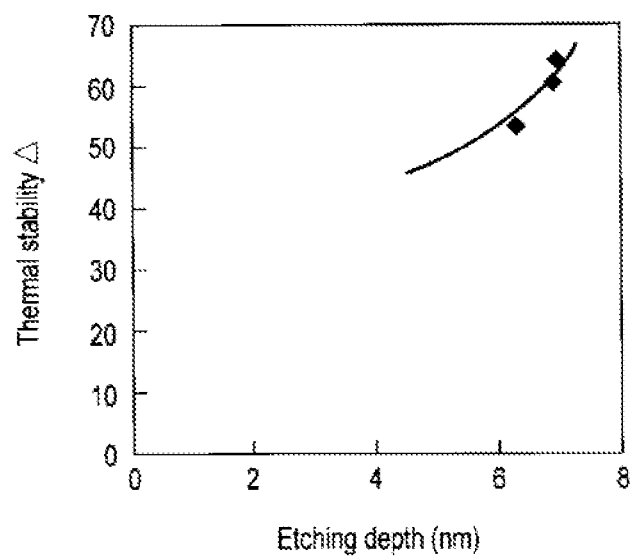
FIG. 8 is a graph illustrating a correlation between an etching amount of an underlayer and thermal stability factor Δ (as a measure of memory retention ability) of a storage layer.

FIG. 8 is a graph illustrating a correlation between the etching amount of the underlayer and the thermal stability factor Δ of the recording layer (CoFeB layer) when the underlayer is ScHfB. The horizontal axis of the graph represents the etching depth (nm) and the vertical axis represents the thermal stability factor Δ of the recording layer. As illustrated in FIG. 8, when the etching depth of the underlayer is less than 7 nm, it is found that the non-volatile property Δ is drastically decreased.

On the other hand, when the underlayer is thick, the underlayer is not easily separated into each MTJ element. When the underlayer is not completely separated and electrically connected, a sneak current is generated and read and write are not possible. From the viewpoint of the processing of separating the underlying wiring, the thickness of the underlayer 12 is preferably 30 nm or less.

(H) According to the embodiment, either or both of the conditions that the crystallization degree of the recording layer 13 is lower than the crystallization degree of the reference layer 15 and that the crystal grains of the recording layer 13 are smaller than the crystal grains of the reference layer 15 are satisfied.

In order to easily read data "1" or data "0", a high MR ratio is required. For example, when MgO is used for the intermediate layer, CoFeB is used for the adjacent reference layer, and CoFeB is used for the recording layer further adjacent to the intermediate layer, respectively, each layer is formed and then heat treatment is performed at 350° C. or higher. A high MR ratio may be obtained by crystallizing CoFeB/MgO/CoFeB.

However, when the intermediate layer and the recording layer are crystallized, a large misfit is formed at the interface between the intermediate layer and the recording layer. The misfit formed at the interface interferes with matching surface formation between the intermediate layer and the recording layer which are heteroepitaxially grown, and the transition is made and grain boundaries are formed. Thus, the intermediate layer and the recording layer are stabilized. By the transition and the grain boundary formation, the particles of the recording layer and the intermediate layer aggregate to form, for example, grains of 10 nm or less, and thus a roughness is formed on the recording layer and the intermediate layer. The roughness formed on the recording layer reduces the activation volume of the recording layer, deteriorates the thermal disturbance resistance (non-volatile property), and increases a write current. The roughness formed on the intermediate layer causes local current concentration to cause poor insulation and deterioration in the MR ratio, which is not preferable.

As described above, in order to improve a read output of data "1" or data "0", it is preferable to promote the crystallization of the intermediate layer, the reference layer adjacent to the intermediate layer, and the recording layer. However, when the crystallization of the recording layer is excessively promoted, the above-described performance deterioration resulting from the roughness is caused, and this case is not preferable.

According to the embodiment, MgO of the intermediate layer 14 and CoFeB of the reference layer 15 adjacent to the intermediate layer 14 are crystallized, and CoFeB of the recording layer 13 adjacent to the intermediate layer 14 is maintained in a microcrystal grain state or an amorphous state. When the recording layer 13 has microcrystal grains or is amorphous, the flatness between the recording layer 13 and the intermediate layer 14 may be reliably obtained. Accordingly, both a high read output and other performance may be obtained.

(I) according to the embodiment, when the conductive layers 13m, 15m, 16m, or the like is subjected to ion milling, the incident angle of the ion beam IB is inclined with respect to the substrate. When the conductive layer 12m is subjected to the ion milling, the incident angle of the ion beam IB is perpendicular to the substrate. Accordingly, the side wall layer 18 derived from the conductive layer 12m may be formed by suppressing the adhesion of the elements derived from the conductive layers 13m, 15m, and 16m to the side walls of the conductive layer 13m, the insulating layer 14m, and the like.

The deposited layer or the side wall layer formed when each layer is subjected to ion milling has an effect of suppressing side wall damage by moisture, etching, or the like. Thus, the formation of the deposited layer or the side wall layer itself is not wrong. However, the deposited layer or the side wall layer derived from various conductive layers may have conductivity and an electric short may occur between the layers.

According to the embodiment, it is possible to suppress formation of side wall layers having low resistance derived from the conductive layers 13m, 15m, and 16m on the side walls of the conductive layer 13m, the insulating layer 14m, and the like. In addition, the conductive layer 12m is configured to include a preferable component such as Sc or the like, and the side wall layer 18 having high resistance derived from the conductive layer 12m may be formed.

4. Modification Example of Embodiment

In a modification example according to the embodiment, the underlayer has a laminated structure. With reference to FIG. 1, an MTJ element of the modification example will be described.

Specifically, an underlayer 12' of the modification example includes a lower underlayer including, for example, Sc, and an upper underlayer as a second underlayer including, for example, AlN. Specifically, the lower underlayer may be formed of a layer including ScHfB. The lower underlayer is provided on the lower electrode 11 and the upper underlayer is provided on the lower underlayer. When a material including AlN is used in the upper underlayer, AlN functions an insulating material. Therefore, when the thickness of the upper underlayer is set to less than 1 nm or AlScN obtained by adding Sc to AlN is used in the upper underlayer, the resistance of the upper underlayer may be low. Thus, the upper underlayer may be configured such that the resistance of the upper underlayer is lower than at least the resistance of the intermediate layer 14, and has insulating properties, for example. The thickness of the lower underlayer may be, for example, about 15 nm, and the thickness of the upper underlayer may be, for example, about 0.5 nm.

When the upper underlayer is disposed on the side close to the recording layer 13, the damping constant of the recording layer 13 may be reduced. The damping constant is a friction coefficient of a material when the precession of magnetization of the material is reversed. In magnetization reverse using spin-implanted electrons (or current), as the damping constant decreases, the magnetization is more easily reversed. Thus, when the damping constant decreases, a write current may be reduced. In other words, when the insulating upper underlayer is inserted, the propagation of spin of the recording layer 13 to the conductive lower underlayer may be suppressed, and thus a write current can be reduced.

In addition, when the upper underlayer is disposed on the side close to the recording layer 13, it is possible to suppress formation of a layer having a low Curie temperature Tc between the recording layer 13 and the underlayer 12'. The Curie temperature Tc refers to a temperature at which a magnetic layer such as the recording layer does not maintain magnetic anisotropy. When the Curie temperature Tc is high, a magnetic material has high heat resistance, and for example, a magnetization disappearing layer (or dead layer) may be reduced. When the magnetization disappearing layer is formed, saturation magnetization (Ms) is reduced and thus the non-volatile property is deteriorated. That is, when the magnetization disappearing layer is reduced, a high non-volatile property may be obtained.

As described above, when the upper underlayer is provided, it is possible to form the recording layer 13 capable of achieving a high MR ratio, a low write current Ic, and a high non-volatile property index.

The upper underlayer may further include a layer including, for example, AlScN on the side close to the lower underlayer, in addition to the layer including AlN. In this case, the thickness of the layer including AlN may be, for example, 0.3 nm or more and 0.7 nm or less. The thickness of the layer including AlScN may be, for example, 0.3 nm or more and 1.5 nm or less. Thus, the flatness of the recording layer 13 may be further improved.

When each layer of the underlayers mutually includes the same kind of materials, the wettability (affinity), which may is relevant when each layer is formed, may be improved and thus each layer is more easily flattened. Specifically, the AlScN layer includes Sc that is the same kind of the material of the lower underlayer. Thus, when the AlScN layer is formed, the AlScN layer exhibits high wettability to the lower underlayer. The AlScN layer and the AlN layer also include the same kind of materials. Therefore, even when the AlN layer is formed, the AlN layer exhibits high wettability to the AlScN layer.

Further, ScN makes a face-centered cubic (fcc) structure stable and AlN makes a hexagonal closest packing (hcp) structure stable. When the AlScN layer in which ScN and AlN are mixed is formed, the AlScN layer is made amorphous and the flatness may be improved.

Furthermore, ScN is conductive, and thus when ScN is included in the underlayer, the resistance of the entire underlayer 12' may be reduced. Accordingly, it is possible to suppress deterioration in the MR ratio that is caused by considering the underlayer 12' as a series resistor. However, when a layer including a nitride is excessively thick, the underlayer has larger resistance than the resistance of the intermediate layer. Therefore, when the layer of AlN or AlScN is formed to have the above thickness, the resistance of the underlayer 12' may be reduced while AlN and AlScN maintain a function as a nitride.

Second Embodiment

Hereinafter, a magnetoresistive effect element according to an embodiment will be described with reference to FIG. 10. An MTJ element 20 as the magnetoresistive effect element according to the embodiment includes a side wall layer 19 on the outer side of the side wall layer 18 as a second side wall layer.

That is, for example, the side wall layer 19 covers the side walls of layers extending from the underlayer 12' to the upper electrode 17 with the side wall layer 18 disposed between the layers and the side wall layer 19. However, the side wall layer 19 may be provided at least on the side wall of the recording layer 13 and a part of the side wall of the intermediate layer 14. The side wall layer 19 includes elements included in the intermediate layer 14, that is, elements that are more susceptible to oxidization than Mg. Specifically, the side wall layer 19 includes, for example, at least one of calcium (Ca), barium (Ba), yttrium (Y), strontium (Sr), samarium (Sm), and dysprosium (Dy). The thickness of the side wall layer 19 is, for example, 1 nm or more and 2 nm or less.

The side wall layer 19 is formed by performing heat treatment or the like after a layer including the above-described materials such as Ca is formed by, for example, a vacuum deposition technique such as an ion beam sputtering method, an ion plating method, a vacuum deposition method, an atomic layer deposition (ALD) method, or a chemical vapor deposition (CVD) method.

Figure 10:
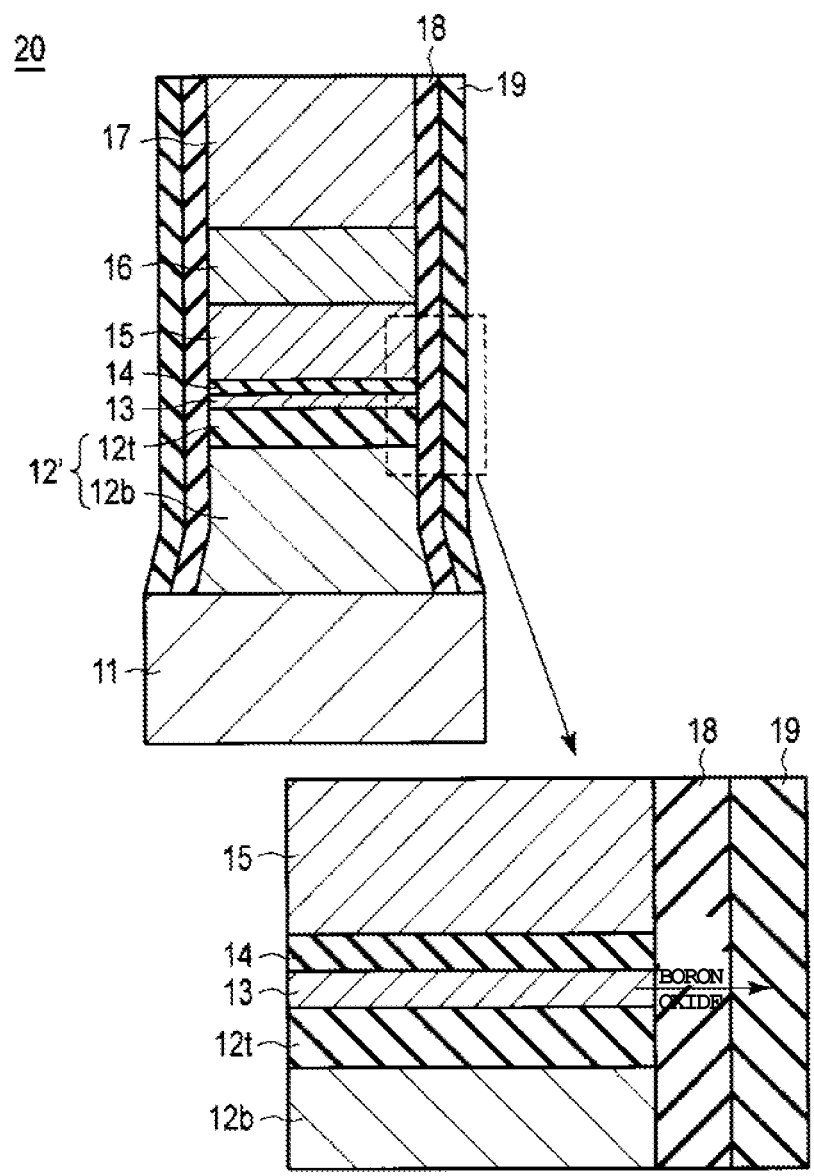
FIG. 10 is a cross-sectional view and a functional illustration diagram of an MTJ element according to a second embodiment.

Further, in the example of FIG. 10, for example, the underlayer 12' having a laminated structure is illustrated. Specifically, as in the above-described modification example, the underlayer 12' includes an upper underlayer 12t and a lower underlayer 12b. The upper underlayer 12t includes, for example, an AlN layer or a laminated structure of AlN/AlScN. The lower underlayer 12b includes, for example, a ScHfB layer.

As described above, when the side wall layer 19 is further disposed on the outer side of the side wall layer 18, in addition to the effects of the above-described embodiment, one or more of the following effects are obtained.

According to the second embodiment, the side wall layer 19 absorbs some of B and O in the recording layer 13 as boron oxide and promotes the crystallization of the recording layer 13 by CoFe. When B is absorbed from the recording layer 13, the crystallization temperature of the recording layer 13 decreases. In addition, Co and Fe may diffuse mutually by using a site from which B is taken out and CoFe is crystallized. Accordingly, the recording layer 13 is sufficiently crystallized and the non-volatile property of the recording layer 13 and the MR ratio of the MTJ element 20 are improved.

According to the second embodiment, the side wall layer 19 absorbs some of B and O in the recording layer 13 as boron oxide to suppress deterioration in the magnetic properties of the recording layer 13. While the melting point of boron is about 2,300° C., the melting point of boron oxide is about 480° C. In the process of manufacturing the MTJ element, there is a concern of boron oxide having a low melting point diffusing in the recording layer or the like by performing various heat treatments. When boron oxide is absorbed by the side wall layer 19, it is possible to suppress impregnation of boron oxide into the recording layer 13 and reduce the damage of the recording layer 13.

According to the second embodiment, the side wall layer 19 improves the side wall protection effect of the recording layer 13 by the side wall layer 18. Accordingly, while a sufficient side wall protection effect is maintained, for example, the side wall layer 18 may be made thin.

Application Examples of Embodiment

Application examples of the above-described embodiments will be described with reference to FIGS. 11 and 12.

The MTJ elements 10 and 20 according to the above-described embodiments may be applied to, for example, STT-MRAM.

1. Circuit Configuration of STT-MRAM

Figure 11:
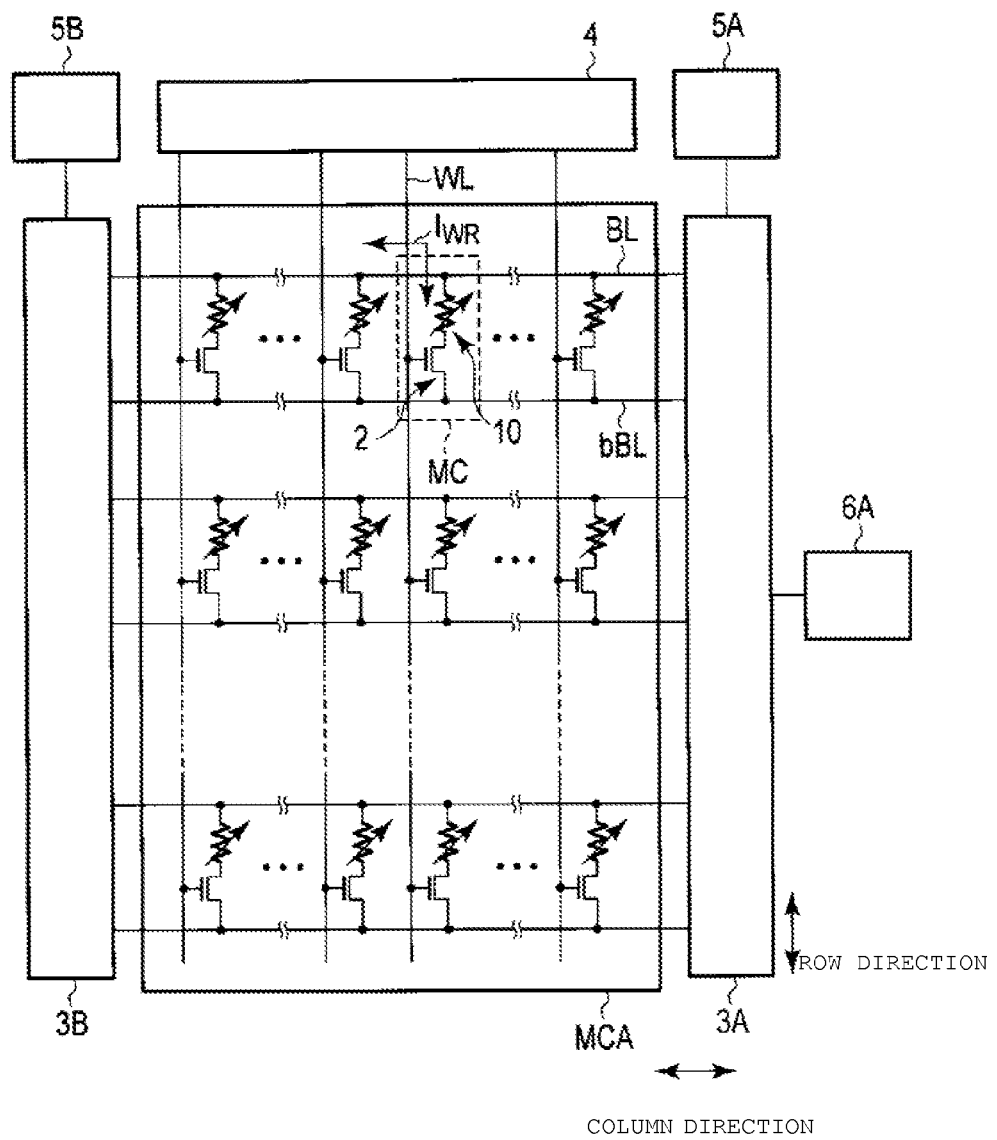
FIG. 11 illustrates an example of a circuit configuration of a magnetic memory device according to an embodiment.

As illustrated in FIG. 11, an STT-MRAM according to this application example includes a memory cell array MCA, column control circuits 3A and 3B, a row control circuit 4, writing circuits 5A and 5B, and a reading circuit 6A.

The memory cell array MCA includes plural memory cells MC. The plural memory cells MC are disposed in the memory cell array MCA in an array shape. Each of the plural memory cells MC is connected to a pair of bit lines BL and bBL and a word line WL extending in the memory cell array MCA. The bit lines BL and bBL extend in the column direction and the word lines WL extend in the row direction. The two bit lines BL and bBL form a bit line pair.

Each memory cell MC includes, for example, one MTJ element 10 and one select transistor (select switch) 2. The MTJ element in the memory cell MC may be, for example, the MTJ element 20 described in the above-described embodiment or the like. The select transistor 2 is, for example, a field effect transistor.

One end of the MTJ element 10 is connected to the bit line BL and the other end of the MTJ element 10 is connected to one end (source/drain) of the current path of the select transistor 2. The other end (drain/source) of the current path of the select transistor 2 is connected to the bit line bBL. The control terminal (gate) of the select transistor 2 is connected to the word line WL.

In this manner, the plural memory cells MC arrayed in the column direction are connected to the common pair of bit lines (bit lines BL and bBL). The plural memory cells MC arrayed in the row direction are connected to the common word line WL.

The column control circuits 3A and 3B are connected to one end and the other end of each of the bit lines BL and bBL, respectively. The column control circuits 3A and 3B control activation or inactivation of the bit lines BL and bBL based on an external address signal. One end of each word line WL is connected to the row control circuit 4. The row control circuit 4 controls activation or inactivation of the word lines WL based on an external address signal.

The writing circuits 5A and 5B are connected to one end and the other end of each of the bit lines BL and bBL through the column control circuits 3A and 3B, respectively. The writing circuits 5A and 5B include a source circuit such as a current source or voltage source to generate a write current $I_{WR}$ and a sink circuit to absorb the write current, respectively. At the time of data write, the writing circuits 5A and 5B supply a write current $I_{WR}$ to an externally selected memory cell MC (hereinafter a selected memory cell).

More specifically, when writing data in the MTJ element 10, the writing circuits 5A and 5B bidirectionally supply a write current $I_{WR}$ to the MTJ element 10 in the memory cell MC according to data to be written to the selected memory cell MC. That is, the writing circuits 5A and 5B output a write current $I_{WR}$ from the bit line BL to the bit line bBL or a write current $I_{WR}$ from the bit line bBL to the bit line BL according to data to be written to the MTJ element 10.

The reading circuit 6A is connected to the bit lines BL and bBL through the column control circuit 3A. The reading circuit 6A includes a current source or voltage source to generate a read current, a sense amplifier that detects and amplifies a read signal, and a latch circuit for temporarily holding data. When reading data from the MTJ element 10, the reading circuit 6A supplies a read current to the selected memory cell MC. Regardless of the example of FIG. 11, two reading circuits may be provided at one end and the other end of the memory cell array MCA in the STT-MRAM in the column direction, respectively.

The current value of the write current is set to be larger than a magnetization reversal threshold value. The current value of the read current is set to be smaller than a magnetization reversal threshold value so that the magnetization of the recording layer 13 of the MTJ element 10 is not reversed by the read current.

The current value or potential is supplied to the read node according to the magnitude of the resistance value of the MTJ element 10. Data stored in the MTJ element 10 is discriminated based on a variation amount (read signal and read output) corresponding to the magnitude of the resistance value.

In addition to the above-described structural elements, for example, a buffer circuit, a state machine (control circuit), or an error checking and correcting (ECC) circuit may be provided in the same chip as that of the memory cell array MCA.

2. Memory Cell Structure

The memory cell MC is formed in an active region AA of a semiconductor substrate 30. The active region AA is defined by an insulating film 31 embedded in the element isolation area of the semiconductor substrate 30. The surface of the semiconductor substrate 30 is covered by inter-layer insulating films 38A, 38B, and 38C.

The MTJ element 10 is provided in the inter-layer insulating film 38C. The MTJ element provided in the inter-layer insulating film 38C may be the MTJ element 20 described above.

The upper end of the MTJ element 10 is connected to the bit line BL through the upper electrode 17. The lower end of the MTJ element 10 is connected to a source/drain diffusion layer 34B of the select transistor 2 through a contact wiring BEC embedded in the inter-layer insulating films 38A and 38B. A source/drain diffusion layer 34A of the select transistor 2 is connected to the bit line bBL through a contact wiring bBEC formed in the inter-layer insulating film 38A.

The select transistor 2 is, for example, a field effect transistor having a planar structure. That is, the select transistor 2 has a gate electrode 33 on a gate insulating film 32 of the active region AA between the source/drain diffusion layer 34A and the source/drain diffusion layer 34B. The gate electrode 33 extends in the row direction and is used as the word line WL.

Figure 12:
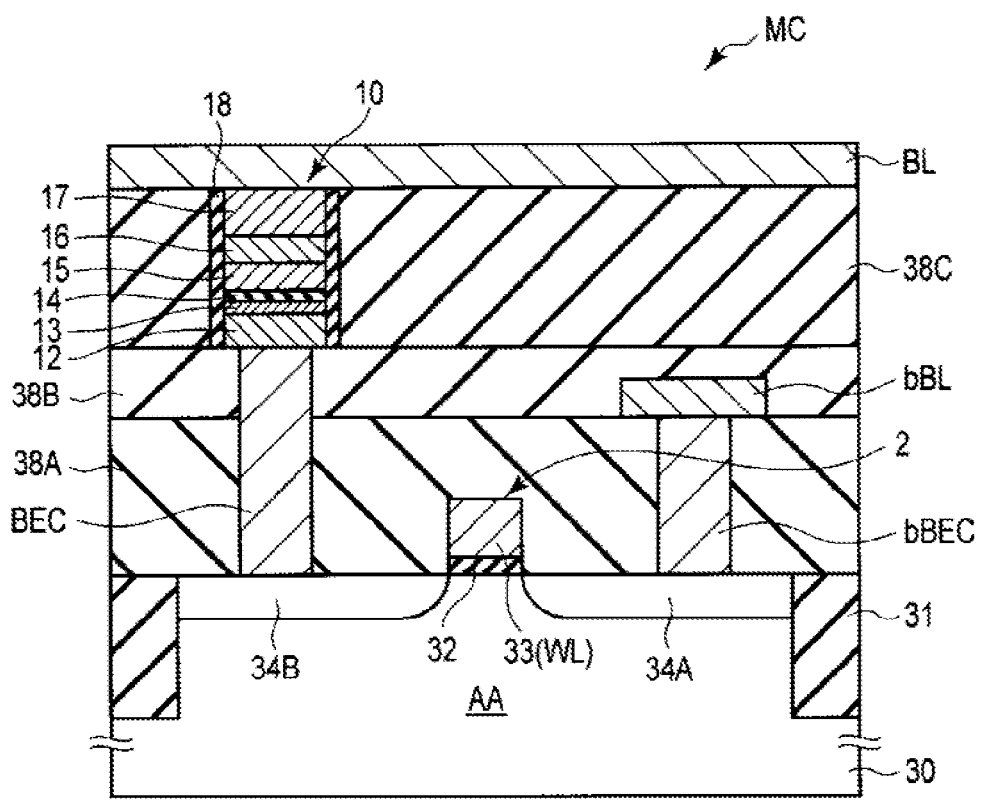
FIG. 12 illustrates an application example of a magnetoresistive effect element according to an embodiment.

Unlike FIG. 12, the MTJ element 10 may be disposed at a position shifted from a position immediately above the contact wiring BEC. Specifically, the MTJ element 10 may be disposed above the gate electrode 33 of the select transistor 2 or the like using, for example, an intermediate wiring layer.

Unlike FIG. 12, the select transistor 2 may be a field effect transistor having a 3D structure. Examples of the field effect transistor having a 3D structure include a recess channel array transistor (RCAT) and FinFET. In the RCAT, the gate electrode is embedded in a trench (recess) in a semiconductor region with a gate insulating film disposed inbetween. In the FinFET, the gate electrode and a strip-shaped semiconductor region (fin) cross each other on different levels with interposing a gate insulating film therebetween.

Unlike FIG. 12, two memory cells MC may be provided in one active region AA so as to be adjacent to each other in the column direction. In this case, the two memory cells MC are disposed, sharing one bit line bBL and the source/drain diffusion layer 34A. The cell size of the memory cell MC can be thus reduced.

Other Embodiments

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the above-described embodiments and modification example, the underlayer 12 includes Sc and the side wall layer 18 includes an oxide of Sc. However, the embodiments are not limited thereto. It is preferable that the element included in the underlayer and the side wall layer be an element which has conductivity, is more susceptible to oxidation in the atmosphere or the like, has insulating properties when being oxidized, and has low diffusibility at a high melting point. As long as the element has these properties, the element included in the underlayer and the side wall layer may be other than Sc. Specific examples of the element having these properties include lanthanoid elements.

That is, the underlayer may include at least one of Sc and lanthanoid elements. The side wall layer may include an oxide of at least one of Sc and lanthanoid elements.

In the above-described embodiments and modification example, each of the MTJ elements 10 and 20 includes the lower electrode 11, the underlayer 12 (12'), the recording layer 13, the intermediate layer 14, the reference layer 15, the stopper layer 16, and the upper electrode 17. However, the embodiments are not limited thereto. For example, a layer including CoFeB as a main component may be disposed between the intermediate layer 14 and the reference layer 15. By disposing such a layer, the polarizability of the reference layer 15 improves and the MR ratio of the MTJ element may further improve. In addition, a shift cancel layer may be disposed between the upper electrode 17 (and the stopper layer 16) and the reference layer 15. The shift cancel layer is a layer for adjusting a magnetic field leak from the reference layer 15 to the recording layer 13. By disposing the shift cancel layer, data that the recording layer 13 holds may be stably maintained.

In the above-described embodiments and modification example, the magnetization directions of the recording layer 13 and the reference layer 15 are directions intersecting the layer surfaces. However, the embodiments are not limited thereto. The magnetization directions of the recording layer and the reference layer may be, for example, directions parallel to the layer surfaces. The direction parallel to the layer surface is a direction that is horizontal or substantially horizontal to the layer surface. That is, the MTJ element may be formed as, for example, a horizontally-magnetized MTJ element having horizontal magnetic anisotropy.

In the above-described embodiments and modification example, the MTJ elements 10 and 20 are of a bottom-free type (top-pin type) in which the record layer 13 is disposed below the reference layer 15. However, the embodiments are not limited thereto. The MTJ element may be of a top-free type (bottom-pin type) in which the recording layer is disposed above the reference layer. In this case, the side wall layer may be formed by vacuum deposition such as an ion beam sputtering method, an ion plating method, a vacuum deposition method, an ALD method, a CVD method, oxidation treatment, and the like.

What is claimed is:

1. A magnetoresistive effect element comprising:
a recording layer having magnetic anisotropy and a variable magnetization direction;
a reference layer having magnetic anisotropy and an invariable magnetization direction;
an intermediate layer between the recording layer and the reference layer;
an underlayer containing scandium (Sc) and disposed on a surface side of the recording layer opposite to a surface side on which the reference layer is disposed; and
a side wall layer containing an oxide of Sc and disposed on side surfaces of the recording layer and the intermediate layer, wherein
the underlayer and the side wall layer include an alloy of scandium-hafnium boron (ScHfB) that has Sc as a main component.

2. The magnetoresistive effect element according to claim 1, wherein
a content percentage of boron (B) included in the underlayer is higher than a content percentage of B included in the side wall layer.

3. The magnetoresistive effect element according to claim 1, wherein
a resistance of the underlayer is lower than a resistance of the intermediate layer.

4. The magnetoresistive effect element according to claim 1, wherein
the underlayer includes microcrystal grains, all of which are 3 nm or less.

5. The magnetoresistive effect element according to claim 1, wherein
the underlayer has an amorphous structure.

6. The magnetoresistive effect element according to claim 1, further comprising:
a layer of aluminum nitride (AlN) disposed between the underlayer and the recording layer.

7. The magnetoresistive effect element according to claim 1, further comprising:
a layer of aluminum scandium nitride (AlScN) between the underlayer and the recording layer; and
a layer of aluminum nitride (AlN) between the layer of aluminum scandium nitride and the recording layer.

8. The magnetoresistive effect element according to claim 1, wherein
a crystallization degree of the recording layer is lower than a crystallization degree of the reference layer.

9. The magnetoresistive effect element according to claim 1, wherein
crystal grains of the recording layer are smaller than crystal grains of the reference layer.

10. The magnetoresistive effect element according to claim 1, further comprising:
a second side wall layer disposed on an outer surface of the side wall layer,
wherein the second side wall layer is more susceptible to oxidization than the intermediate layer.

11. A magnetoresistive effect element comprising:
a recording layer having magnetic anisotropy and a variable magnetization direction;
a reference layer having magnetic anisotropy and an invariable magnetization direction;
an intermediate layer between the recording layer and the reference layer;
an underlayer containing scandium (Sc) and disposed on a surface side of the recording layer opposite to a surface side on which the reference layer is disposed;
a layer of aluminum scandium nitride (AlScN) between the underlayer and the recording layer;
a layer of aluminum nitride (AlN) between the layer of aluminum scandium nitride and the recording layer; and
a side wall layer containing an oxide of Sc and disposed on side surfaces of the recording layer and the intermediate layer.

12. The magnetoresistive effect element according to claim 11, wherein
a resistance of the underlayer is lower than a resistance of the intermediate layer.

13. The magnetoresistive effect element according to claim 11, wherein
the underlayer includes microcrystal grains, all of which are 3 nm or less.

14. The magnetoresistive effect element according to claim 11, wherein
the underlayer has an amorphous structure.

15. The magnetoresistive effect element according to claim 11, wherein
a crystallization degree of the recording layer is lower than a crystallization degree of the reference layer.

16. The magnetoresistive effect element according to claim 11, wherein
crystal grains of the recording layer are smaller than crystal grains of the reference layer.

17. The magnetoresistive effect element according to claim 11, further comprising:
a second side wall layer disposed on an outer surface of the side wall layer,
wherein the second side wall layer is more susceptible to oxidization than the intermediate layer.

18. A magnetoresistive effect element comprising:
a recording layer having magnetic anisotropy and a variable magnetization direction;
a reference layer having magnetic anisotropy and an invariable magnetization direction, crystal grains of the recording layer being smaller than crystal grains of the reference layer;
an intermediate layer between the recording layer and the reference layer;
an underlayer containing scandium (Sc) and disposed on a surface side of the recording layer opposite to a surface side on which the reference layer is disposed; and
a side wall layer containing an oxide of Sc and disposed on side surfaces of the recording layer and the intermediate layer.

19. The magnetoresistive effect element according to claim 18, wherein
a crystallization degree of the recording layer is lower than a crystallization degree of the reference layer.

20. The magnetoresistive effect element according to claim 18, further comprising:
a second side wall layer disposed on an outer surface of the side wall layer,
wherein the second side wall layer is more susceptible to oxidization than the intermediate layer.

* * * * *